(12) United States Patent
Sim et al.

(10) Patent No.: US 7,075,142 B2
(45) Date of Patent: Jul. 11, 2006

(54) CELL ARRAYS OF MEMORY DEVICES HAVING EXTENDED SOURCE STRAPPING REGIONS

(75) Inventors: Sang-pil Sim, Gyeonggi-do (KR); Chan-kwang Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/988,785

(22) Filed: Nov. 15, 2004

(65) Prior Publication Data

US 2005/0173743 A1 Aug. 11, 2005

(30) Foreign Application Priority Data

Feb. 9, 2004 (KR) .................. 10-2004-0008395

(51) Int. Cl.
*H01L 29/788* (2006.01)
(52) U.S. Cl. ............... 257/316; 257/314; 257/315
(58) Field of Classification Search ........ 257/314, 257/315, 316; 438/201, 211, 257, 266
See application file for complete search history.

(56) References Cited

U.S. PATENT DOCUMENTS

| 5,041,886 A | * | 8/1991 | Lee ........................... 257/320 |
| 5,643,812 A | * | 7/1997 | Park .......................... 438/264 |
| 5,770,874 A | * | 6/1998 | Egawa ....................... 257/296 |
| 5,973,374 A | | 10/1999 | Longcor |
| 6,275,414 B1 | | 8/2001 | Randolph et al. |
| 6,392,267 B1 | * | 5/2002 | Shrivastava et al. ........ 257/316 |
| 6,541,324 B1 | | 4/2003 | Wang |
| 6,867,082 B1 | * | 3/2005 | Kim et al. .................. 438/201 |
| 6,949,791 B1 | * | 9/2005 | Abedifard .................. 257/315 |

FOREIGN PATENT DOCUMENTS

| KR | 2002-0097284 A | 12/2002 |
| KR | 2003-0036111 A | 5/2003 |
| WO | WO 01/88985 A2 | 11/2001 |

OTHER PUBLICATIONS

Notice to Submit a Response/Amendment to the Examination Report for Korean patent application No. 10-2004-0008395 mailed on Sep. 24, 2005

* cited by examiner

*Primary Examiner*—Eddie Lee
*Assistant Examiner*—Ajay Arora
(74) *Attorney, Agent, or Firm*—Myers Bigel Sibley & Sajovec

(57) ABSTRACT

A cell array of a flash memory device includes extended source strapping regions. The cell array includes a device isolation layer and active regions. The device isolation layer is formed in a semiconductor substrate, and the active regions are defined by the device isolation layer. Word lines cross over the active regions, and a common source line electrically connects the active regions between two word lines of word line pairs. A source strapping region is defined between the two word lines of the word line pairs. The source strapping region crosses multiple active regions.

21 Claims, 9 Drawing Sheets

CELL ARRAYS OF MEMORY DEVICES HAVING EXTENDED SOURCE STRAPPING REGIONS

RELATED APPLICATION

This application claims the benefit under 35 U.S.C. §119 of Korean Patent Application No. 2004-0008395, filed Feb. 9, 2004, the disclosure of which is hereby incorporated herein by reference in its entirety as if set forth fully herein.

FIELD OF THE INVENTION

The present invention relates to semiconductor devices in general, and specifically, to cell arrays of memory devices having source strapping regions.

BACKGROUND OF THE INVENTION

Integrated circuit memory devices are widely used for consumer and commercial applications. One commonly used non-volatile memory device is a flash memory device. In general, cell arrays of flash memory devices include a plurality of cell transistors. Each of the cell transistors is selected by word lines and bit lines. Source regions of a plurality of cell transistors are electrically connected to each other. The source regions are connected by a common source line. In order to reduce the resistance of the common source line, the common source line includes source strapping regions formed at regular intervals, and a strapping line having high conductivity is connected to the source strapping regions.

FIGS. 1A and 1B show a cell array of a conventional NOR-type flash memory device.

Referring to FIGS. 1A and 1B, a plurality of active regions 10 and 12, defined by a device isolation layer, are formed on a semiconductor substrate. A plurality of word lines WL cross over the active regions 10 and 12. Two adjacent word lines WL provide word line pairs WP. Source regions 14 are formed in active regions 10 between the two word lines of the word line pairs WP. The source regions 14 are electrically connected by a common source line CSL. Drain regions 16 are formed in the active regions 10 between adjacent word line pairs WP. A device isolation layer between the two word lines of the word line pairs WP is removed, so that it is absent. As a result, the common source line CSL electrically connects a plurality of active regions 10 and 12.

Drain contacts BC are connected to the drain regions 16, and source contacts SC are connected to the common source line CSL at regular intervals, respectively. In order to increase integration, the width of the common source line CSL may be narrower than that of the drain region. Accordingly, a region for forming the source contact SC may be desired. In order to form the source contact SC, the common source line CSL includes a wider region that is provided at regular intervals. The wider region corresponds to a source strapping region SR. The word lines WL are bent adjacent the source strapping region SR so that a region where the source contact SC will be formed may be secured.

When a memory device has relatively low integration, the pitch of the active regions can be large. As a result, there may be little or no degradation of adjacent cell transistors when the word lines WL are bent in the source strapping region SR. Accordingly, the active regions 10 and 12 may be formed at regular intervals. However, as the integration of the memory device increases, the pitch of the active regions 10 and 12 becomes small, and the word lines WL bent in the source strapping region SR may cause degradation of adjacent cell transistors. Therefore, as illustrated in FIGS. 1A and 1B, as the pitch of a cell array becomes small, an active region 12 passing the source strapping region SR may be wider in comparison with other active regions 10. The wider active region 12 can reduce or prevent a cell transistor adjacent to the source strapping region SR from being degraded.

An entire surface of a substrate including the word lines WL is covered with an interlayer dielectric layer 18. The drain contact BC penetrates the interlayer dielectric layer 18 to thereby connect to the drain region 16. The common source line CSL is formed by an impurity region implanted into an active region between the word lines where the device isolation layer is removed. A plurality of bit lines BL and source strapping lines SSL are formed crossing over the word lines WL on the interlayer dielectric layer in response to each of the active regions 10. The bit lines BL are connected to a drain contact BC, and the source strapping line SSL is connected to a source contact SC.

SUMMARY OF THE INVENTION

Cell arrays of memory devices, such as flash memory devices, according to exemplary embodiments of the present invention, include a device isolation layer in a semiconductor substrate that defines a plurality of active regions that are spaced apart from one another. A plurality of word line pairs cross over the active regions. A common source line extends between word lines of the respective word line pairs. The common source line includes first portions and second portions that are wider than the first portions. The second portions can provide source strapping regions. A respective second portion crosses a plurality of the spaced apart active regions. In some embodiments, a source strapping line also is provided, wherein the second portions are electrically connected to the source strapping line.

In some embodiments, a plurality of source contacts are provided, a respective one of which crosses a plurality of the spaced apart active regions and electrically connects a respective second portion of the common source line to the source strapping line. In other embodiments, a plurality of groups of source contacts are provided, a respective group of which electrically connects a respective second portion of the common source line to the source strapping line, wherein a respective source contact in a group is contained within (i.e., does not extend beyond) a respective one of the plurality of the spaced apart active regions.

In yet other embodiments, adjacent active regions merge into respective connection portions that overlap respective second portions of the common source lines. In still other embodiments, the plurality of active regions are regularly spaced apart from one another.

In still other embodiments, a cell array of a memory device, such as a flash memory device, includes spaced apart active regions with a regular pitch. The cell array includes a device isolation layer and a plurality of active regions. The device isolation layer is in a semiconductor substrate, and the plurality of active regions are defined by the device isolation layer at a regular pitch. A plurality of word lines cross over the active region in a row direction, and active regions between two word lines of the word line pairs are electrically connected by a common source line. A plurality of drain regions are formed on a plurality of active regions between two word line pairs, respectively. The drain regions are arranged in the row and column directions in the cell array. A source strapping region is provided between two word lines of word line pairs. The source strapping regions are arranged in the row and column directions in the cell array. The source strapping regions cross a plurality of active regions.

Furthermore, the cell array includes a plurality of drain contacts and source contacts. A drain contact is connected to a drain region, and a source contact is connected to an intersection of a respective active region and the source strapping region. The source contact may be connected to a single active region. In addition, one source contact may be connected to a plurality of active regions. The cell array further includes bit lines connected to the drain contacts and source strapping lines connected to the source contacts. The bit lines and source strapping lines may be formed at the same pitch as the active regions. In addition, one source strapping line may be arranged over a plurality of active regions.

DETAILED DESCRIPTION

Figure 1A:
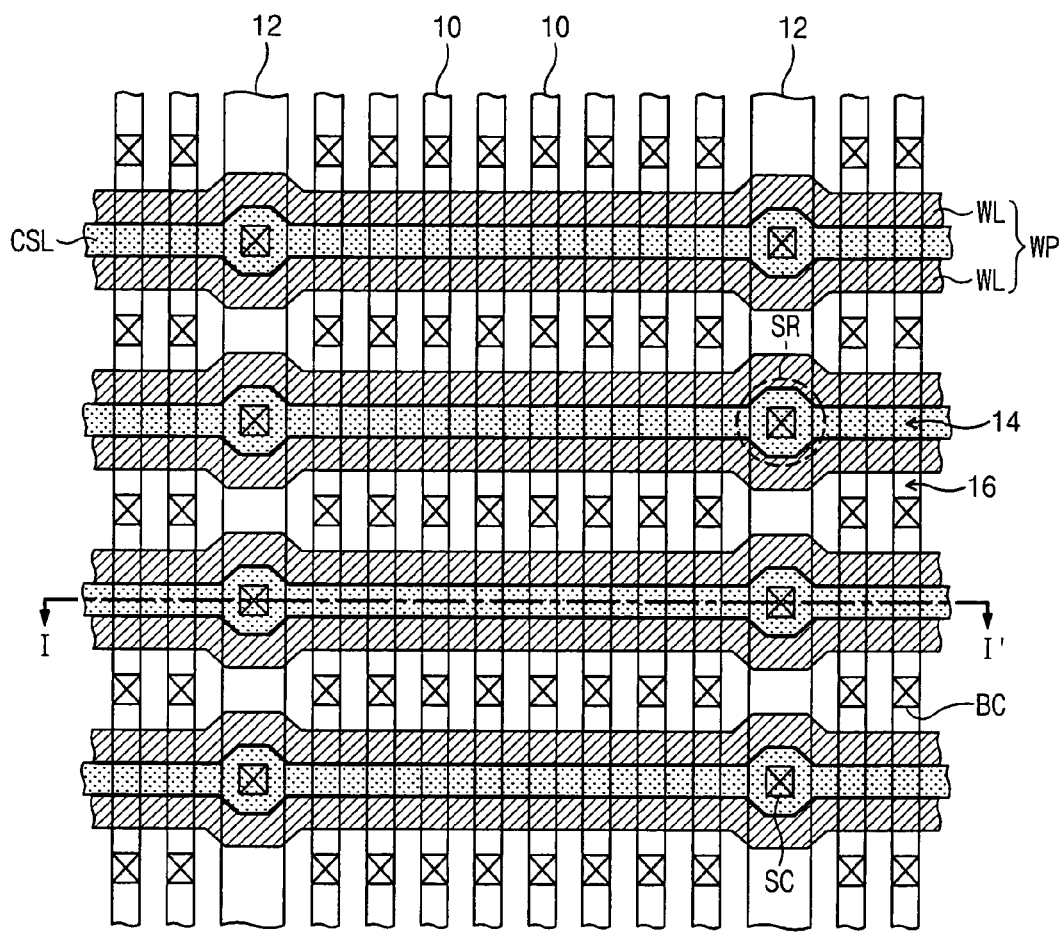
FIGS. 1A and 1B is a plan view and a cross-sectional view, respectively, of a cell array of a conventional NOR-type flash memory device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Furthermore, relative terms such as "below" or "above" may be used herein to describe a relationship of one layer or region to another layer or region relative to a substrate or base layer as illustrated in the figures. It will be understood that these terms are intended to encompass different orientations of the device in addition to the orientation depicted in the figures. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", specify the presence of stated features, regions, steps, operations, elements, and/or components, but do not preclude the presence or addition of one or more other features, regions, steps, operations, elements, components, and/or groups thereof.

Embodiments of the invention are described herein with reference to plan views and cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, sharp angles illustrated herein will, typically, have rounded corners rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" and "column" indicate two non-parallel directions that may be orthogonal to one another. However, the terms row and column do not indicate a particular horizontal or vertical orientation.

Figure 2A:
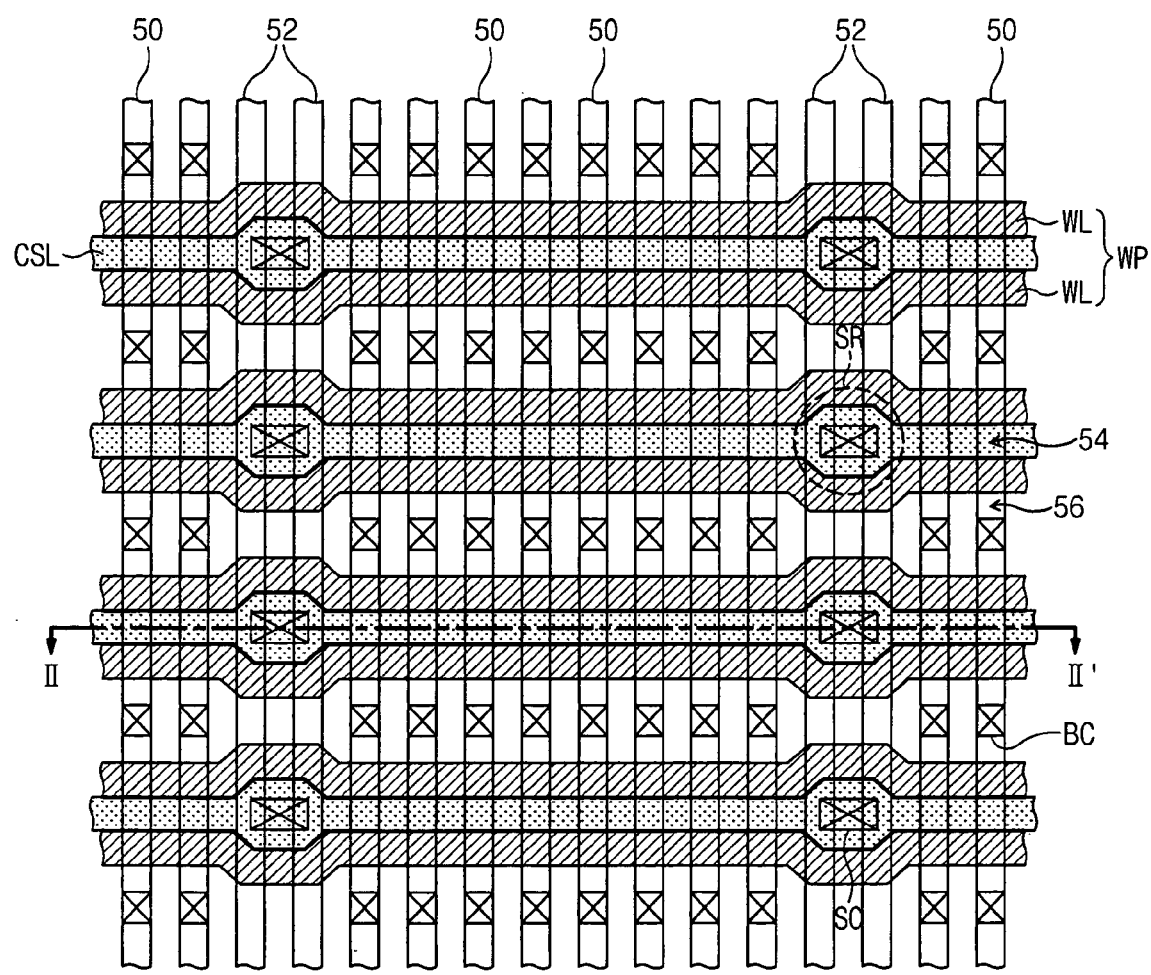
FIG. 2A is a plan view showing a cell array of a flash memory device in accordance with first embodiments of the present invention.

FIG. 2A is a plan view showing a cell array of a memory device, such as a flash memory device, according to first embodiments of the present invention.

Figure 2B:
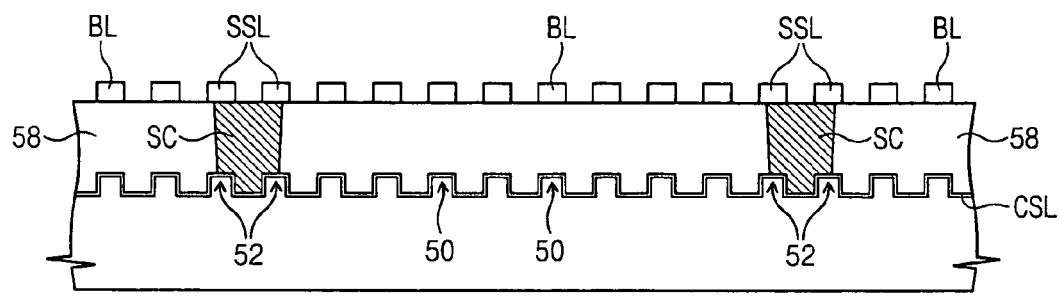
FIG. 2B is a cross-sectional view showing a cell array of a flash memory device in accordance with the first embodiments, taken along line II–II' of FIG. 2A.

FIG. 2B is a cross-sectional view showing a cell array of a memory device according to the first embodiments of the present invention, taken along line II–II' in FIG. 2A.

Figure 2C:
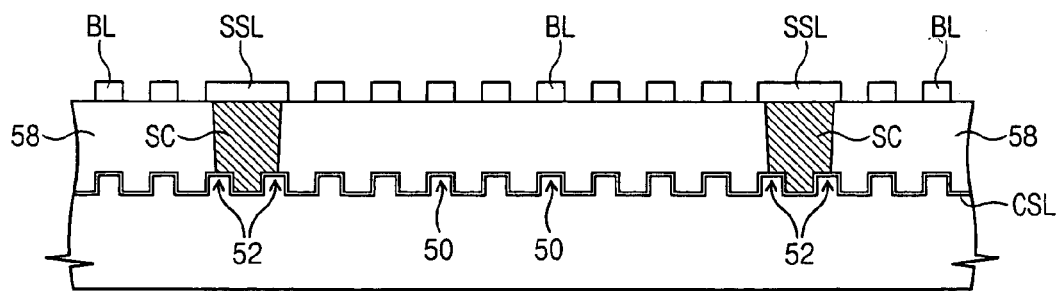
FIG. 2C is a cross-sectional view showing a cell array of a flash memory device in accordance with a modification of the first embodiments, taken along line II–II' of FIG. 2A.

FIG. 2C is a cross-sectional view showing a cell array of a memory device according to a modification of the first embodiments of the present invention, taken along line II–II' in FIG. 2A.

Referring to FIGS. 2A and 2B, a plurality of active regions 50 and 52, defined by a device isolation layer, are arranged on a semiconductor substrate. The active regions 50 and 52 may be spaced apart from each other in parallel at a regular pitch. A plurality of word lines WL are arranged to cross over the active regions 50 and 52. Two facing word lines WL define a word line pair WP. Accordingly, a plurality of word line pairs WP cross over the active regions 50 and 52. Source regions 54 are formed in active regions between two word lines of a word line pair. The source regions 54 between two word lines WL are electrically connected to form a common source line CSL. As shown in FIG. 2B, the common source line CSL may be formed of an impurity (doping) layer implanted into a substrate where a device isolation layer is absent. Drain regions 56 are formed on active regions between adjacent word line pairs WP.

Drain contacts BC are connected to the drain regions 56, respectively. A source contact SC is connected to the common source line CSL at regular intervals. The width of the drain region 56 may be wider than that of the common source line CSL. However, the width of the common source line CSL may be extended in a region where the source contact SC is formed so that a source strapping region SR is formed. The source strapping region SR may also be defined by bending the word lines.

Figure 1B:
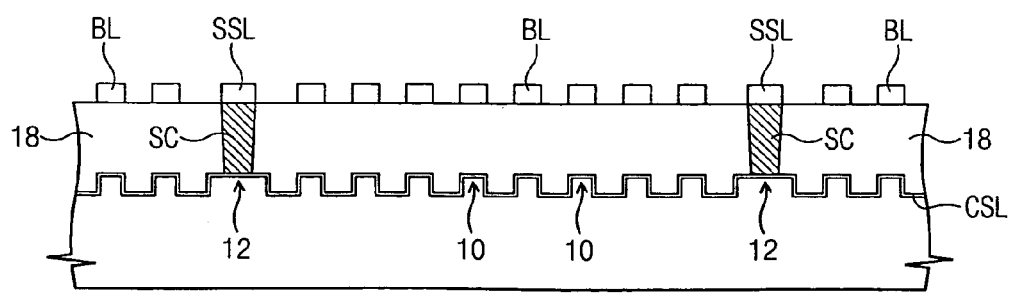

In a conventional cell array, a source strapping region is provided at an intersection of one active region (see 12 in FIG. 1A) and one common source line CSL. Moreover, conventionally, in order to prevent deformation of a cell transistor adjacent to a strapping region due to the bent structure of a word line, an active region crossing the strapping region has a wider width. As a result, as shown in FIGS. 1A and 1B, the pitch of the active regions is changed periodically, which can lead to deformation of the active region in a portion where a pitch is changed. In contrast, according to some embodiments of the present invention, and as shown in FIGS. 2A–2C, the source strapping region SR is defined at an intersection of a plurality of active regions 52 and the common source line CSL in a cell array. Accordingly, extended source strapping regions are provided. Stated differently, the common source line CSL extends between word lines WL of the respective word line pairs WP (in the horizontal direction of FIG. 2A). The common source line CSL includes first portions and second portions SR. The second portions SR of the common source line CSL are wider (in the vertical direction of FIG. 2A) than the first portions, and a respective second portion SR crosses a plurality of the spaced apart active regions 52. Therefore, it is possible to secure a source contact region and to reduce or prevent deformation of an active region due to a variation of a pitch. As shown in FIGS. 2B and 2C, a single source contact SC may be connected to two active regions 52 of the source strapping region SR.

An interlayer dielectric layer 58 is provided on the surface of the semiconductor substrate. The drain contact BC and the source contact SC penetrate the interlayer dielectric layer 58 to be respectively connected to a drain region 16 and a source strapping region SR. Accordingly, the cell array comprises a plurality of drain contacts BC that are arranged in the row and column directions, and a plurality of source contacts SC that are also arranged in the row and column directions. A plurality of bit lines BL and source strapping lines SSL are arranged over the interlayer dielectric layer 58. The bit lines BL are disposed over the active regions 50 to connect the drain contacts BC in the column direction in parallel. The source strapping lines SSL are disposed over the active regions 52 to connect the sources to source contacts in the column direction in parallel.

As shown in FIG. 2B, since the source strapping lines SSL and the bit lines BL correspond to the active region 50 and 52, they may be formed at the same pitch. Accordingly, it is possible to restrain deformation of the source strapping lines SSL and the bit lines BL by a proximity effect. In FIG. 2B, a source contact SC is connected to a plurality of source strapping lines SSL simultaneously. In contrast, as shown in FIG. 2C, one source strapping line SSL may be formed over a source contact SC. In FIG. 2C, interconnections composed of BL and SSL have an irregular pitch, thereby causing a deformation of a pattern. However, unlike the deformation of the active region, the deformation of interconnection pattern may not greatly influence a characteristic dispersion of the cell array. In addition, it is possible to reduce power dissipation and signal delay because of the increased width of the source strapping line SSL.

Figure 3A:
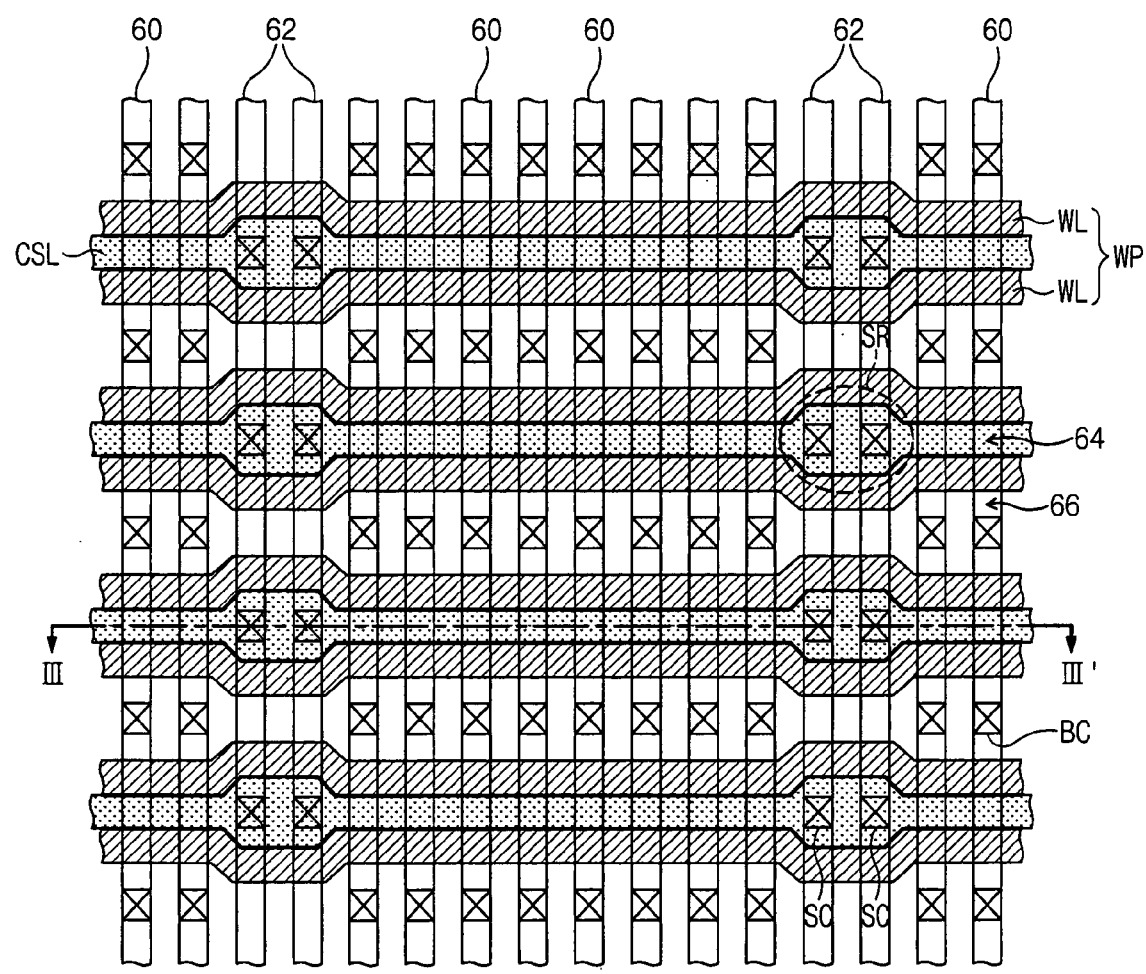
FIG. 3A is a plan view showing a cell array of a flash memory device in accordance with second embodiments of the present invention.

FIG. 3A is a plan view showing a cell array of a memory device, such as a flash memory device, according to second embodiments of the present invention.

Figure 3B:
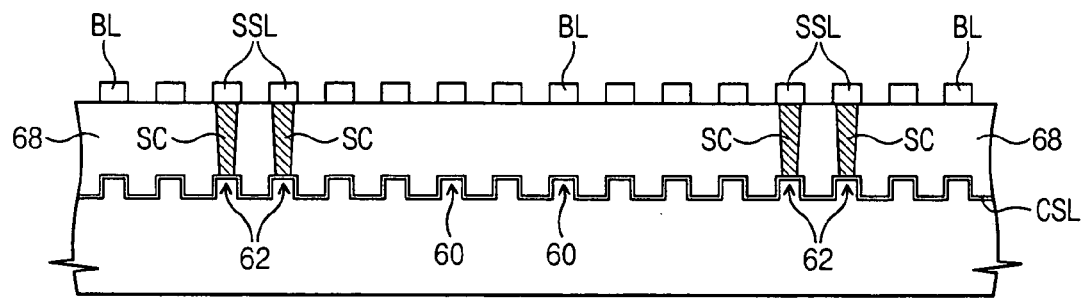
FIG. 3B is a cross-sectional view showing a cell array of a flash memory device in accordance with the second embodiments, taken along line III–III' of FIG. 3A.

FIG. 3B is a cross-sectional view showing a cell array of a memory according to the second embodiments of the present invention, taken along line III–III' in FIG. 3A.

Figure 3C:
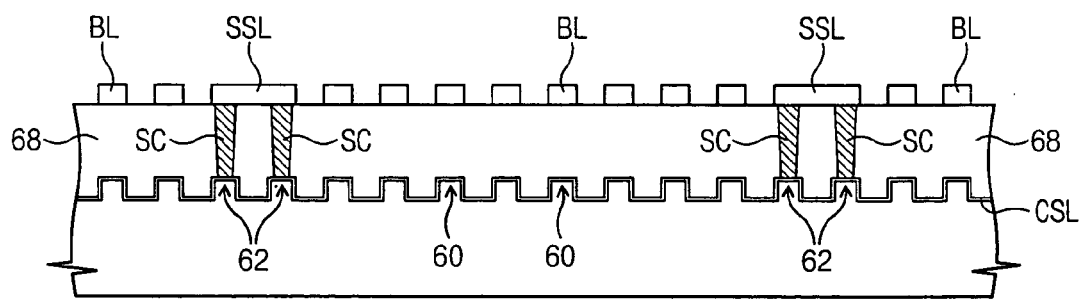
FIG. 3C is a cross-sectional view showing a cell array of a flash memory device in accordance with a modification of the second embodiments, taken along line III–III' of FIG. 3A.

FIG. 3C is a cross-sectional view showing a cell array of a memory device according to a modification of the second embodiments of the present invention, taken along line III–III' in FIG. 3A.

Referring to FIGS. 3A and 3B, a plurality of active regions 60 and 62, defined by a device isolation layer, are arranged in a semiconductor substrate. The active regions 60 and 62 are spaced apart from each other in parallel at regular pitch. A plurality of word lines WL are arranged to cross over the active regions 60 and 62. Two facing word lines WL define a word line pair WP. Accordingly, a plurality of word line pairs WP cross over the active regions 60 and 62. A source region 64 is formed in active regions between two word lines WL forming each word line pair WP. Source regions 64 between two word lines WL are electrically connected to form a common source line CSL. As shown in FIG. 3B, the common source line CSL may be formed of an impurity (doping) layer implanted into a substrate where a device isolation layer is removed. Drain regions 66 are formed in the active regions between adjacent word line pairs, respectively.

Drain contacts BC are connected to the drain regions 66. A plurality of source contacts SC are connected to the common source line CSL at regular intervals. In order to secure a contact region, the width of the drain region 66 is wider than that of the common source line CSL. However, the width of the common source line CSL in a region where the source contact SC is formed is extended to form a source strapping region SR. The source strapping region SR is defined by the bent word lines. Accordingly, extended source strapping regions are provided. Stated differently, the common source line CSL extends between word lines WL of the respective word line pairs WP, and includes first portions and second portions SR. The second portions SR of the common source line CSL are wider (in the vertical direction of FIG. 3A) than the first portions, and a respective second portion SR crosses a plurality of the spaced apart active regions 62.

In a conventional cell array, as the pitch of the cell array becomes small, the pitch may change in an active region crossing a source strapping region. As a result, the configuration of the active region may be transformed. In contrast, in a cell array according to some embodiments of the present invention, the source strapping region SR comprises a plurality of active regions 62 crossing a common source line CSL. Accordingly, it is possible to secure a source contact region and reduce or prevent a deformation of an active region according to a variation of a pitch. As shown in FIGS. 3A–3C, a source contact SC is connected to active regions of the source strapping region SR, respectively. Compared with the first embodiments, contact areas of a source contact and a substrate may be decreased. However, potential problems due to step coverage of regions between active regions and device isolation regions can be reduced or overcome in forming a contact.

An interlayer dielectric layer 68 is provided on the surface of the semiconductor substrate. The drain contact BC and the source contact SC penetrate the interlayer dielectric layer 68 to be respectively connected to a drain region 66 and a source strapping region SR. Accordingly, the cell array includes a plurality of drain contacts BC, which are arranged in the row and column directions. In addition, the cell array includes a plurality of source contacts SC, which are also arranged in the row and column directions. A plurality of bit lines BL and source strapping lines SSL are arranged over the interlayer dielectric layer 68. The bit lines BL connect drain contacts in the column direction in parallel over the active regions 60. The source strapping line SSL connects source contacts SC in the column direction in parallel over the active region 62.

As shown in FIG. 3B, since the source strapping lines SSL and the bit lines BL correspond to the active regions 60 and 62, they may be formed at the same pitch. Therefore, it is possible to reduce or minimize deformation of the source strapping lines SSL and the bit lines BL due to a proximity effect. In FIG. 3B, a plurality of source strapping lines SSL are arranged over a source strapping region SR arranged in the column direction. The source strapping lines SSL connect a plurality of source contacts SC in parallel. A plurality of source contacts SC are arranged in the column direction, respectively. In contrast, as shown in FIG. 3C, one source strapping line SSL may be formed over the source contact SC. Accordingly, a plurality of source contacts SC in each of the source strapping regions SR are connected to the source strapping line SSL. In FIG. 3C, interconnections composed of BL and SSL have an irregular pitch, thereby causing a deformation of a pattern. However, unlike the deformation of the active region, the deformation of interconnection pattern may not greatly influence a characteristic dispersion of the cell array. In addition, it is possible to reduce power dissipation and signal delay because of the increased width of the source strapping line SSL.

Figure 4A:
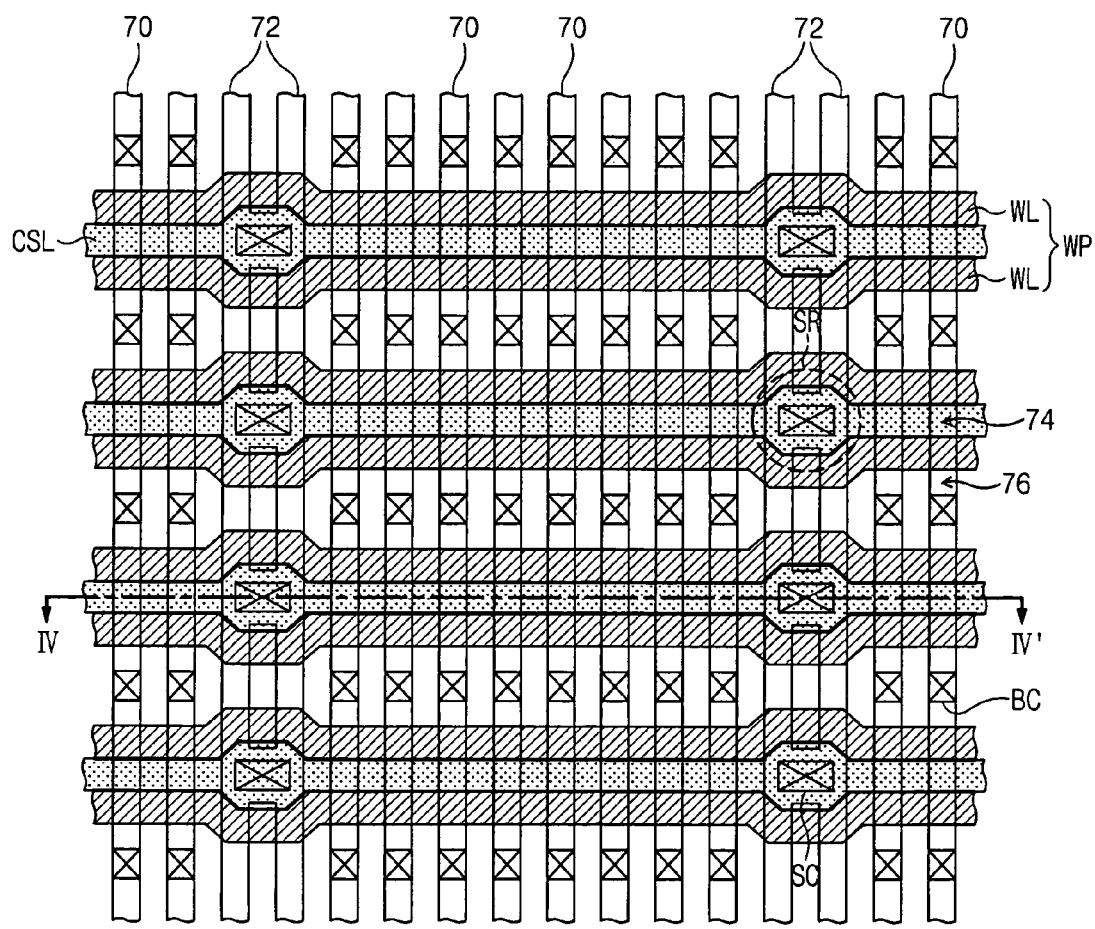
FIG. 4A is a plan view showing a cell array of a flash memory device in accordance with third embodiments of the present invention.

FIG. 4A is a plan view showing a cell array of a memory device, such as a flash memory device, according to the third embodiment of the present invention.

Figure 4B:
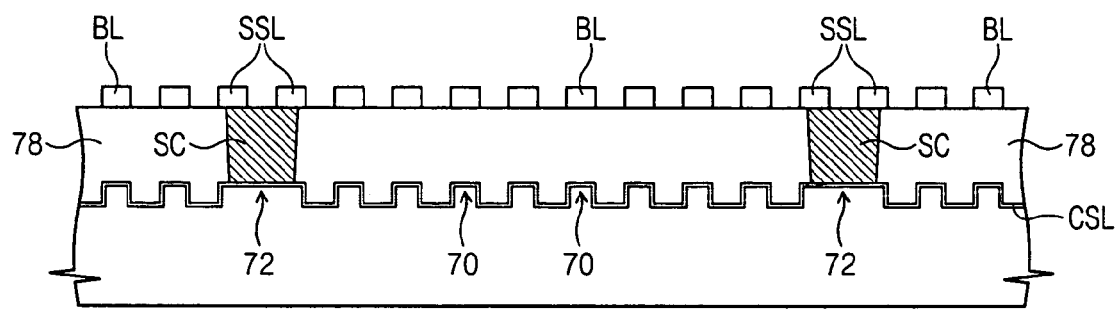
FIG. 4B is a cross-sectional view showing a cell array of a flash memory device in accordance with the third embodiments, taken along line IV–IV' of FIG. 4A.

FIG. 4B is a cross-sectional view showing the cell array of the memory device according to third embodiments of the present invention, taken along line IV–IV' of FIG. 4A.

Figure 4C:
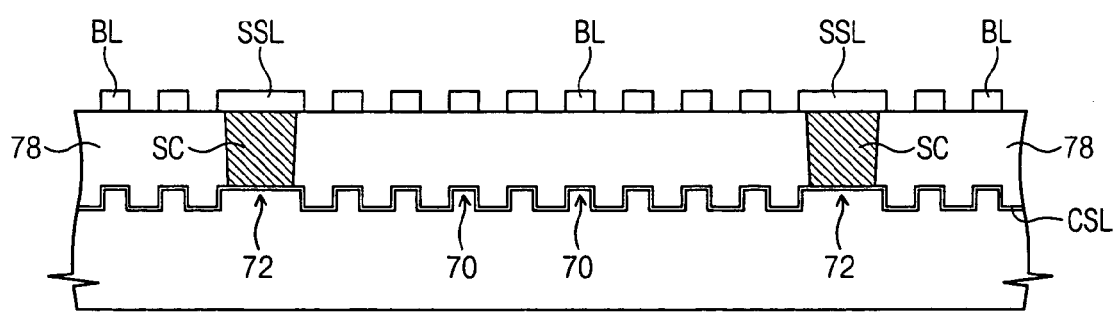
FIG. 4C is a cross-sectional view showing a cell array of a flash memory device in accordance with a modification of the third embodiments, taken along line IV–IV' of FIG. 4A.

FIG. 4C is a cross-sectional view showing a cell array of a memory device according to a modification of the third embodiments of the present invention, taken along line IV–IV' of FIG. 4A.

Referring to FIGS. 4A and 4B, a plurality of active regions 70 and 72, defined by a device isolation layer, are arranged in a semiconductor substrate. The active regions 70 and 72 are spaced apart from each other in parallel at regular pitch. Some of adjacent active regions 72 merge into a plurality of connection portions. The device isolation layer defines an active region so as to arrange a connection portion of adjacent active regions in the row and column directions in the cell array. The connection portion of the adjacent regions corresponds to a source strapping region SR. Stated differently, the connection portions overlap respective second portions of the common source lines. A plurality of word lines WL are arranged to cross over the active regions 70 and 72. Two facing word lines WL define a word line pair WP. Accordingly, a plurality of word line pairs WP cross over the active regions 70 and 72. Source regions 74 are formed in active regions between two word lines WL forming each word line pair WP, respectively. The source regions 74 between two word lines WL are electrically connected to form a common source line CSL. As shown in FIG. 4B, the common source line CSL may be formed of an impurity (doping) layer implanted into a substrate where a device isolation layer is removed. Drain regions 76 are formed in active regions between adjacent word line pairs WP.

In the same way as embodiments mentioned above, drain contacts BC are connected to drain regions 76, respectively. A plurality of source contacts SC are connected to the common source line CSL at regular intervals. In order to secure a contact region, the width of the drain region 76 is wider than that of the common source line CSL. However, the width of the common source line CSL in a region where the source contact SC is formed is extended to form a source strapping region SR. The source strapping region SR also may be defined by bent word lines. Accordingly, extended source strapping regions are provided. Stated differently, the common source line CSL extends between word lines WL of the respective word line pairs WP (in the horizontal direction of FIG. 4A), and includes both first portions and second portions SR that are wider (in the vertical direction of FIG. 4A) than the first portions, wherein a respective second portion SR crosses a plurality of the spaced apart active regions 72.

In a cell array according to some embodiments of the present invention, the source strapping region SR comprises a plurality of active regions 72 crossing the common source line CSL. A plurality of active regions are connected in the source strapping region SR. Accordingly, it is possible to secure a source contact region and to reduce or prevent a deformation of an active region according to a variation of a pitch. As shown in FIGS. 4A–4C, the source contact SC is connected to an active region connected to the source strapping region SR. Since active regions are connected in the source strapping region, potential problems due to step difference of regions between active regions and the device isolation regions can be overcome.

An interlayer dielectric layer 78 is provided on the surface of the semiconductor substrate. The drain contact BC and the source contact SC penetrate the interlayer dielectric layer to be respectively connected to a drain region 76 and a strapping region SR. The drain contacts BC are arranged in the row and column directions. The source contacts SC are also arranged in the row and column directions. A plurality of bit lines BL and the source strapping lines SSL are disposed over the interlayer dielectric layer 78. The bit lines BL and the source strapping lines SSL connect the drain contact BC in the column direction in parallel over the active regions 70 and 72. In addition, the bit lines BL and the source strapping lines SSL connect the source contacts SC in the column direction in parallel over the active regions 70 and 72.

As shown in FIG. 4B, since the source strapping lines SSL and the bit lines BL correspond to the active regions 70 and 72, they may be formed at the same pitch. Accordingly, it is possible to reduce or minimize deformation of the source strapping lines SSL and the bit lines BL due to a proximity effect. In FIG. 4B, a plurality of source strapping lines SSL are disposed over the source strapping region SR arranged in the column direction. The source strapping lines SSL connect a plurality of the source contacts SC in parallel, which are respectively arranged in the column direction. Therefore, the source contact SC is connected to a plurality of the source strapping lines SSL simultaneously. In contrast, as shown in FIG. 4C, one source strapping line SSL may be formed over the source contact SC.

Figure 5A:
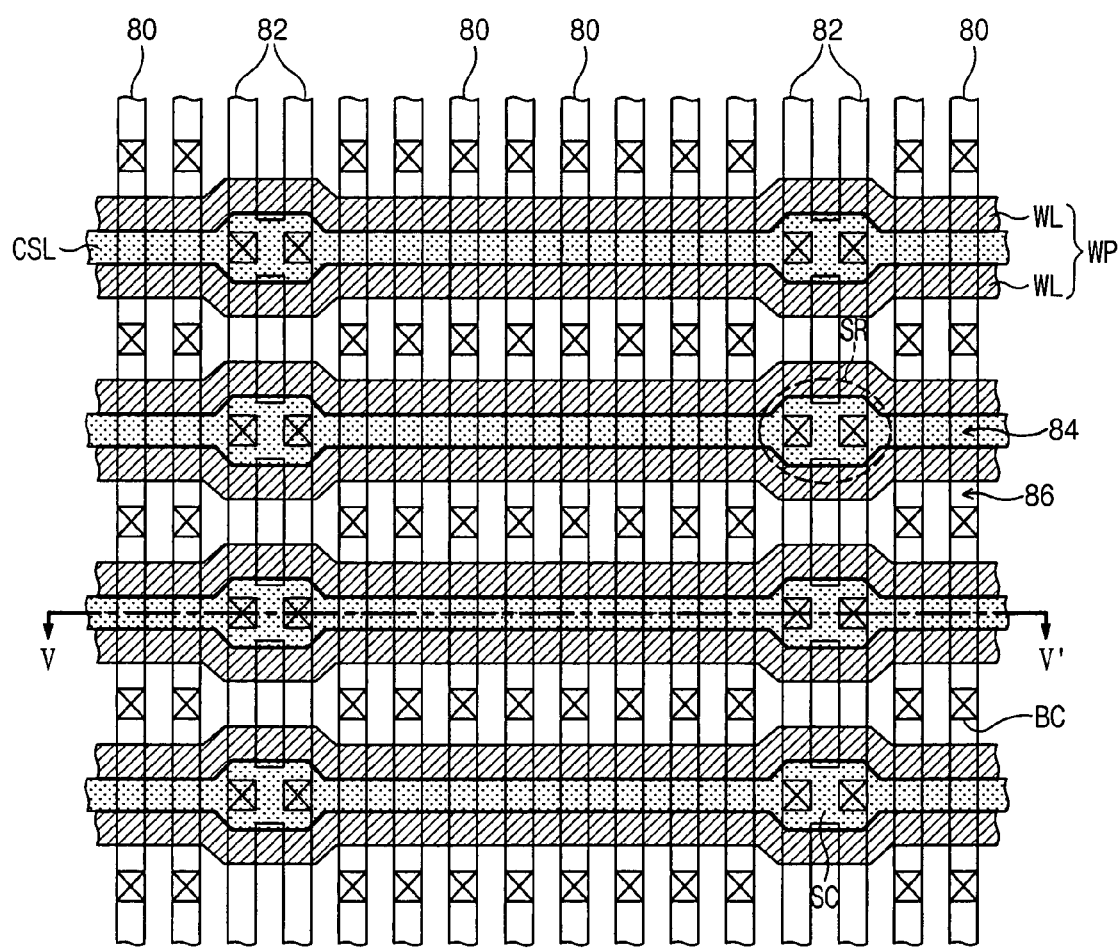
FIG. 5A is a plan view showing a cell array of a flash memory device in accordance with fourth embodiments, of the present invention.

FIG. 5A is a plan view showing a cell array of a memory device, such as a flash memory device, according to fourth embodiments of the present invention.

Figure 5B:
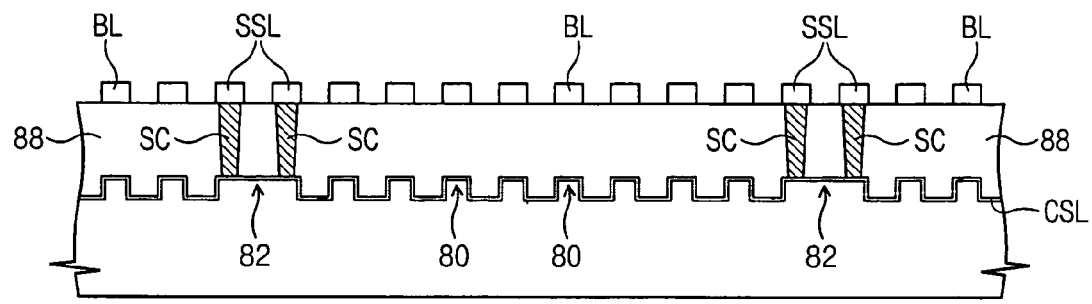
FIG. 5B is a cross-sectional view showing a cell array of a flash memory device in accordance with the fourth embodiments taken along line V–V' of FIG. 5B.

FIG. 5B is a cross-sectional view showing a cell array of a memory device according to fourth embodiments of the present invention, taken along line V–V' of FIG. 5A.

Figure 5C:
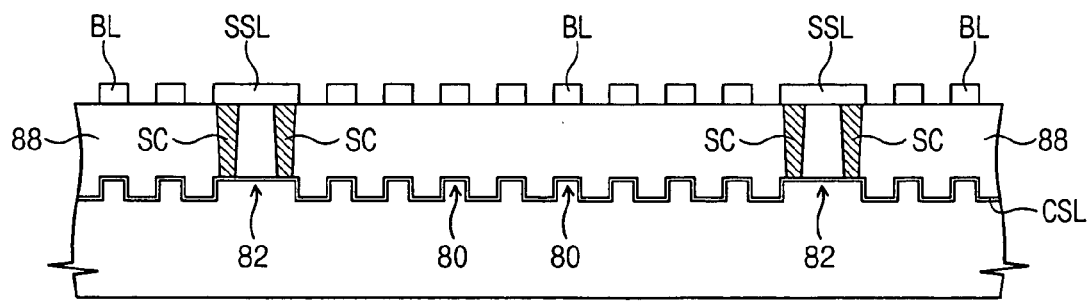
FIG. 5C is a cross-sectional view showing a cell array of a flash memory device in accordance with a modification of the fourth embodiments, taken along line V–V' of FIG. 5A.

FIG. 5C is a cross-sectional view showing a modification of the fourth embodiments of the present invention, taken along line V–V' of FIG. 5A.

Referring to FIGS. 5A and 5B, a plurality of active regions 80 and 82, defined by a device isolation layer, are arranged in a semiconductor substrate. The active regions 80 and 82 are spaced apart from each other in parallel at regular pitch. Some of adjacent regions 82 merge into a plurality of connection portions. The device isolation layer defines an active region so as to arrange a connection portion of adjacent active regions in the row and column directions in the cell array. The connection portion of the adjacent regions corresponds to a source strapping region SR. Stated differently, the connection portions overlap respective second portions of the common source lines. A plurality of word lines WL are arranged to cross over the active regions 80 and 82. Two facing word lines WL define a word line pair WP. Accordingly, a plurality of word line pairs WP cross over the active regions 80 and 82. Source regions 84 are formed in active regions between two word lines WL forming each word line pair WP, respectively. The source regions 84 between two word lines WL are electrically connected to form a common source line CSL. As shown in FIG. 5B, the common source line CSL may be formed of an impurity (doping) layer implanted into a substrate where a device isolation layer is removed. Drain regions 86 are formed in active regions between adjacent word line pairs WP.

In the same way as embodiments mentioned above, drain contacts BC are connected to drain regions 86. A plurality of source contacts SC are connected to a common source line CSL at regular intervals. In order to secure a contact region, the width of the drain region 86 is wider than that of the common source line CSL. However, the width of the common source line CSL in regions where the source contact SC is formed becomes extended to form the source strapping region SR. The source strapping region SR is defined by bent word lines. Accordingly, extended source strapping regions are provided. Stated differently, the common source line CSL extends between word lines WL of the respective word line pairs WP (in the horizontal direction in FIG. 5A), and includes both first portions and second portions SR that are wider (in the vertical direction of FIG. 5A) than the first portions, wherein a respective second portion SR crosses a plurality of the spaced apart active regions 82.

In a cell array according to some embodiments of the present invention, the source strapping region SR comprises a plurality of active regions 82 crossing the common source line CSL. A plurality of active regions are connected in the source strapping region SR. Accordingly, it is possible to secure a source contact region and to reduce or prevent a deformation of an active region according to a variation of a pitch. As shown in FIGS. 5A–5C, the source contact SC is connected to active regions of the source strapping region SR, respectively. In other words, irrespective of a connection portion of the active regions 82, a source contact SC is connected to each of the active regions 82 crossing the source strapping region SR.

An interlayer dielectric layer 88 is provided on the surface of the semiconductor substrate. The drain contact BC and the source contact SC penetrate the interlayer dielectric layer 88 to be connected to the drain region and the source strapping region SR, respectively. Accordingly, the cell array includes a plurality of drain contacts BC arranged in the row and column directions. In addition, the cell array includes a plurality of source contacts SC arranged in the row and column directions. A plurality of bit lines BL and the source strapping lines are arranged over the interlayer dielectric layer 88. The bit lines BL and the source strapping lines SSL connect drain contacts BC in the column direction in parallel over the active regions 80 and 82. In addition, the bit lines BL and the source strapping lines SSL connect source contacts SC in the column direction in parallel over the active regions 80 and 82.

As shown in FIG. 5B, since the source strapping lines SSL and the bit lines BL correspond to the active regions 80 and 82, they are formed at the same pitch. Accordingly, it is possible to reduce or minimize deformation of the source strapping lines SSL and the bit lines BL due to a proximity effect. In FIG. 5B, a plurality of source strapping lines SSL are arranged over the source strapping region SR, which are arranged in the column direction. The source strapping lines SSL connect a plurality of source contacts SC in parallel, which are respectively arranged in the column direction. Accordingly, the source contact SC is connected to one source strapping line SSL. In contrast, as shown in FIG. 5C, one source strapping line SL is formed over the source strapping region SR. As a result, source contacts SC of each of the source strapping regions SR are connected to the same source strapping line SSL in parallel.

According to some embodiments of the invention, an active region is arranged at a regular pitch in a cell array of a memory device, such as a flash memory device. Accordingly, it is possible to reduce or prevent deformation of an active region due to a proximity effect. In addition, since a source strapping region includes a plurality of active regions, it is possible to reduce or prevent a cell transistor adjacent to the source strapping region from structural deformation by reducing a pattern pitch.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A cell array of a memory device comprising:
   a device isolation layer in a semiconductor substrate that defines a plurality of active regions at a regular pitch;
   a plurality of word line pairs crossing over the active regions in a row direction;
   a common source line electrically connected to the active regions between two word lines of the word line pairs;
   a plurality of drain regions, a respective one of which is in a respective one of the plurality of active regions between the word line pairs and arranged in the row direction and a column direction; and
   a source strapping region between the two word lines of the word line pairs and arranged in the row and column directions, wherein the source strapping region crosses a plurality of active regions.

2. The cell array of claim 1, further comprising:
   a plurality of drain contacts; and
   a plurality of source contacts respectively connected to an intersection of active regions and the source strapping region.

3. The cell array of claim 2, further comprising bit lines and source strapping lines, which correspond to the active regions and are arranged at a regular pitch to cross over the word lines, wherein a respective bit line is connected to respective drain contacts arranged in the column direction; and
   wherein a respective source strapping line is connected to respective source contacts arranged in the column direction.

4. The cell array of claim 2, further comprising bit lines and source strapping lines crossing over the word lines, wherein a respective bit line is connected to respective drain contacts arranged in the column direction;
   wherein a respective source strapping line is disposed over a plurality of active regions crossing the source strapping region and connected to source contacts; and
   wherein the respective source contacts on a respective source strapping region are connected to a respective source strapping line.

5. The cell array of claim 1, further comprising:
   a plurality of drain contacts, a respective one of which is connected to a respective drain region; and
   a plurality of source contacts, a respective one of which is connected to the plurality of active regions crossing a respective source strapping region.

6. The cell array of claim 5, further comprising bit lines and source strapping lines, which correspond to the active regions, wherein a respective bit line is connected to respective drain contacts arranged in the column direction;
   wherein a respective source strapping line is connected to respective source contacts arranged in the column direction; and
   wherein a respective source contact is connected to a plurality of source strapping lines crossing over a respective source strapping region.

7. The cell array of claim 5, further comprising bit lines and source strapping lines, which cross over the word lines, wherein a respective bit line is connected to respective drain contacts arranged in the column direction; and
   wherein a respective source strapping line is disposed over a plurality of active regions crossing the source strapping line and connected to respective source contacts arranged in the column direction.

8. The cell array of claim 1, wherein the active regions are electrically connected through a common source line by absence of the device isolation layer between the respective two word lines that define the word line pairs.

9. The cell array of claim 1, wherein the device isolation layer defines active regions connected in the source strapping region.

10. The cell array of claim 9, further comprising:
    a plurality of drain contacts connected to a respective drain region; and
    a source contact connected to the source strapping region.

11. The cell array of claim 10, further comprising bit lines and source strapping lines, which correspond the active regions and cross over the word lines, wherein a respective bit line is connected to respective drain contacts arranged in the column direction;
    wherein a respective source strapping line is connected to respective source contacts arranged in the column direction; and
    wherein a respective source contact is connected to a plurality of source strapping lines crossing over a respective source strapping region.

12. The cell array of claim 10 further comprising bit lines and source strapping lines, which cross over the word lines, wherein a respective bit line is connected to respective drain contacts arranged in the column direction; and
    wherein a respective source strapping line is disposed over a plurality of active regions crossing the source strapping region and connected to respective source contacts arranged in the column direction.

13. The cell array of claim 9, further comprising:
    a plurality of drain contacts, a respective one of which is connected to a respective drain region; and
    a plurality of source contacts, a respective one of which is connected to active regions crossing a respective source strapping region.

14. The cell array of claim 1 further comprising bit lines and source strapping lines, which correspond to the active regions and are arranged at a regular pitch and cross over the word lines, wherein a respective bit line is connected to respective drain contacts arranged in the column direction; and
    wherein a respective source strapping line is connected to respective source contacts arranged in the column direction.

15. The cell array of claim 13, further comprising bit lines and source strapping lines, which cross over the word lines, wherein a respective bit line is connected to respective drain contacts arranged in the column direction; and
    wherein a respective source strapping line is disposed over a plurality of active regions crossing the source strapping region and connected to respective source contacts; and
    wherein the respective source contacts on a respective source strapping line are connected to a respective source strapping line.

16. A cell array of a memory device comprising:
    a device isolation layer in a semiconductor substrate that defines a plurality of active regions that are spaced apart from one another;
    a plurality of word line pairs crossing over the active regions; and
    a common source line that extends between word lines of the respective word line pairs, the common source line including first portions and second portions that are wider than the first portions, wherein a respective second portion crosses a plurality of the spaced apart active regions.

17. The cell array of claim 16 further comprising a source strapping line, wherein the second portions are electrically connected to the source strapping line.

18. The cell array of claim 16 further comprising:
a source strapping line; and
a plurality of source contacts, a respective one of which crosses a plurality of the spaced apart active regions and electrically connects a respective second portion to the source strapping line.

19. The cell array of claim 16 further comprising:
a source strapping line; and
a plurality of groups of source contacts, a respective group of which electrically connects a respective second portion to the source strapping line, wherein a respective source contact in a group is contained within a respective one of the plurality of the spaced apart active regions.

20. The cell array of claim 16 wherein adjacent active regions merge into respective connection portions that overlap respective second portions of the common source lines.

21. A cell array of claim 16 wherein the plurality of active regions are regularly spaced apart from one another.

* * * * *